United States Patent
Qin et al.

(10) Patent No.: US 7,592,212 B2
(45) Date of Patent: Sep. 22, 2009

(54) METHODS FOR DETERMINING A DOSE OF AN IMPURITY IMPLANTED IN A SEMICONDUCTOR SUBSTRATE

(75) Inventors: Shu Qin, Boise, ID (US); Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/784,241

(22) Filed: Apr. 6, 2007

(65) Prior Publication Data

US 2008/0248597 A1  Oct. 9, 2008

(51) Int. Cl.
H01L 21/337 (2006.01)

(52) U.S. Cl. .................................................... 438/181

(58) Field of Classification Search ............. 438/16–14, 438/166, 174, 181, 486, 513–516, 630, 676, 438/783; 257/72, 378, 382, 405, 402
See application file for complete search history.

(56) References Cited

U.S. PATENT DOCUMENTS

| | | | |
|---|---|---|---|
| 5,132,545 A * | 7/1992 | Shono et al. ............. 250/492.2 |
| 5,508,227 A | 4/1996 | Chan et al. |
| 5,883,016 A | 3/1999 | Chan et al. |
| 6,050,218 A | 4/2000 | Chen et al. |
| 6,528,805 B2 | 3/2003 | Fang et al. |
| 6,632,482 B1 | 10/2003 | Sheng |
| 6,753,253 B1 * | 6/2004 | Takahashi et al. ........... 438/676 |
| 6,960,498 B2 * | 11/2005 | Nakamura ................. 438/181 |
| 6,984,833 B2 * | 1/2006 | Sano et al. ............. 250/492.21 |
| 2004/0005745 A1 * | 1/2004 | Nakamura ................. 438/174 |
| 2004/0016402 A1 | 1/2004 | Walther et al. |
| 2004/0251432 A1 * | 12/2004 | Sano et al. ............. 250/492.21 |
| 2006/0005768 A1 * | 1/2006 | Nakamura ................. 118/715 |
| 2006/0088655 A1 | 4/2006 | Collins et al. |
| 2006/0121707 A1 | 6/2006 | Lee |
| 2006/0237138 A1 | 10/2006 | Qin |

OTHER PUBLICATIONS

Qin et al., Co-Gas Impact of B2H6 Plasma Diluted with Helium on the Plasma Doping Process in a Pulsed Glow-Discharge System, J. Vac. Sci. Technol. B 23(6), Nov./Dec. 2005, pp. 2272-2277.

Qin et al., Characterization and Optimization of a Plasma Doping Process Using a Pulsed RF-Excited B2H6 Plasma System, Surface and Coatings Technology, 2006, pp. 1-9.

(Continued)

*Primary Examiner*—Walter L Lindsay, Jr.
*Assistant Examiner*—Andre' C Stevenson
(74) *Attorney, Agent, or Firm*—TraskBritt

(57) ABSTRACT

Methods of determining a total impurity dose for a plasma doping process, and an apparatus configured to determine same. A total ion dose implanted in a semiconductor substrate is directly measured, such as by utilizing a Faraday cup. A ratio of impurity-based ion species to non-impurity-based ion species in a plasma generated by the plasma doping process and a ratio of each impurity-based ion species to a total impurity-based ion species in the plasma are directly measured. The ratios may be directly measured by ion mass spectroscopy. The total ion dose and the ratios are used to determine the total impurity dose. The apparatus includes an ion detector, an ion mass spectrometer, a dosimeter, and software.

22 Claims, 4 Drawing Sheets

OTHER PUBLICATIONS

Godet et al., Plasma Doping Implant Depth Profile Calculation Based on Ion Energy Distribution Measurements, J. Vac. Sci. Technol. B 24(5), Sep./Oct. 2006, pp. 2391-2397.

Mass and Energy Analyser for Plasma Diagnostics, Hiden Analytical Product Catalog, http//www.hiden.co.uk/products/cat28.html, Jan. 3, 2007, 1 page.

* cited by examiner

METHODS FOR DETERMINING A DOSE OF AN IMPURITY IMPLANTED IN A SEMICONDUCTOR SUBSTRATE

FIELD OF THE INVENTION

Embodiments of the invention relate generally to the manufacture of semiconductor devices and, more specifically, to methods and an apparatus for determining a dose of an impurity implanted into a semiconductor substrate.

BACKGROUND

Plasma doping ("PLAD"), also known as Plasma Immersion Ion Implantation ("PIII"), processes are known in the art and are used to implant impurities into a semiconductor substrate. The semiconductor substrate is placed on a cathode within a plasma chamber and a doping gas including the desired impurity to be implanted is introduced into the plasma chamber. Positive ions from the doping gas are accelerated towards the semiconductor substrate and include impurity-based ion species, as well as non-impurity-based ion species. As used herein, the term "impurity-based ion species" means and includes ionic species in a plasma that include at least one atom of the impurity to be implanted in the semiconductor substrate and the term "non-impurity-based ion species" means and includes ionic species in the plasma that lack, or do not include, at least one atom of the impurity. As such, the impurity-based ion species account for a portion of the total ion species present in the plasma and implanted in the semiconductor substrate.

Since multiple ion species are produced and implanted in the semiconductor substrate, determining the dopant dose ("dosimetry") or total impurity dose is a challenge with PLAD processes. As used herein, the phrase "total impurity dose" refers to the number of dopant atoms implanted per unit area of the semiconductor substrate and is reported as the number of implanted impurity atoms/cm$^2$ of the semiconductor substrate. One dosimetry approach has been to monitor a total ion dose with a Faraday cup and then determine the total impurity dose by an ex situ or trial and error method. As used herein, the term "total ion" means and includes the combination of impurity-based ion species and non-impurity-based ion species and the term "total ion dose" means and includes the total number of impurity-based ions and non-impurity-based ions implanted per unit area of the semiconductor substrate. Depending on the doping gas used, multiple impurity-based ion species and/or multiple non-impurity-based ion species may be present in the plasma. One trial and error method involves using Secondary Ion Mass Spectroscopy ("SIMS") to determine the total impurity dose and profile in the semiconductor substrate. The SIMS is conducted after the PLAD process is complete. The total ion dose determined with the Faraday cup in used in conjunction with the SIMS measurements to determine the total impurity dose. Another trial and error method utilizes four point probe resistance measurements and Spreading Resistance Profiling ("SRP") measurements to determine the total impurity dose and profile and is conducted after the PLAD process and a post-implant annealing activation process. Both of these trial and error methods are undesirable because the semiconductor substrates are broken or cleaved to determine the total impurity dose. These methods are also undesirable because the total impurity dose is not determined until after the PLAD process is complete. As such, if the tested semiconductor substrate does not include the desired total impurity dose, the batch of semiconductor substrates subjected to the same implant conditions as the tested semiconductor substrate is discarded. The implantation conditions are then changed on a subsequent batch of semiconductor substrates, these semiconductor substrates are tested, and the process repeated until the implantation conditions produce the desired total impurity dose in the semiconductor substrate. The iterative nature of the trial and error methods is time consuming and wasteful because semiconductor substrates are destroyed in order to determine the total impurity dose. Additionally, these methods suffer from poor accuracy, controllability, and repeatability.

Therefore, it would be desirable to develop a method and an apparatus to determine impurity dosage of a semiconductor substrate during an implantation process, providing the capability of real-time process control.

BRIEF DESCRIPTION OF THE SEVERAL VIEWS OF THE DRAWINGS

While the specification concludes with claims particularly pointing out and distinctly claiming that which is regarded as the present invention, the embodiments of this invention can be more readily ascertained from the following description of the invention when read in conjunction with the accompanying drawings in which:

DETAILED DESCRIPTION OF THE INVENTION

Methods and an apparatus for determining or calculating a total impurity dose implanted into a semiconductor substrate during a PLAD process are disclosed. As used herein, the term "semiconductor substrate" means and includes a conventional silicon substrate or other bulk substrate having a layer of semiconductor material. As used herein, the term "bulk substrate" means and includes not only silicon wafers, but also silicon-on-insulator ("SOI") substrates, silicon-on-sapphire ("SOS") substrates, glass substrates, such as for flat panel displays, epitaxial layers of silicon on a base semiconductor foundation, and other semiconductor, optoelectronics, or biotechnology materials, such as silicon-germanium, germanium, gallium arsenide, or indium phosphide. To implant a desired dopant or impurity into the semiconductor substrate, the semiconductor substrate may be placed in a plasma chamber and exposed to a plasma generated by the PLAD process. The plasma may be generated from a doping gas that includes the desired impurity.

The methods herein do not describe a complete PLAD process. Rather, since PLAD processes are known in the art, only the methods necessary to understand embodiments of the present invention are described herein. Reference will now be made to the Figures, wherein like numerals refer to like parts throughout. It should be understood that the Figures are not necessarily drawn to scale.

Figure 1:
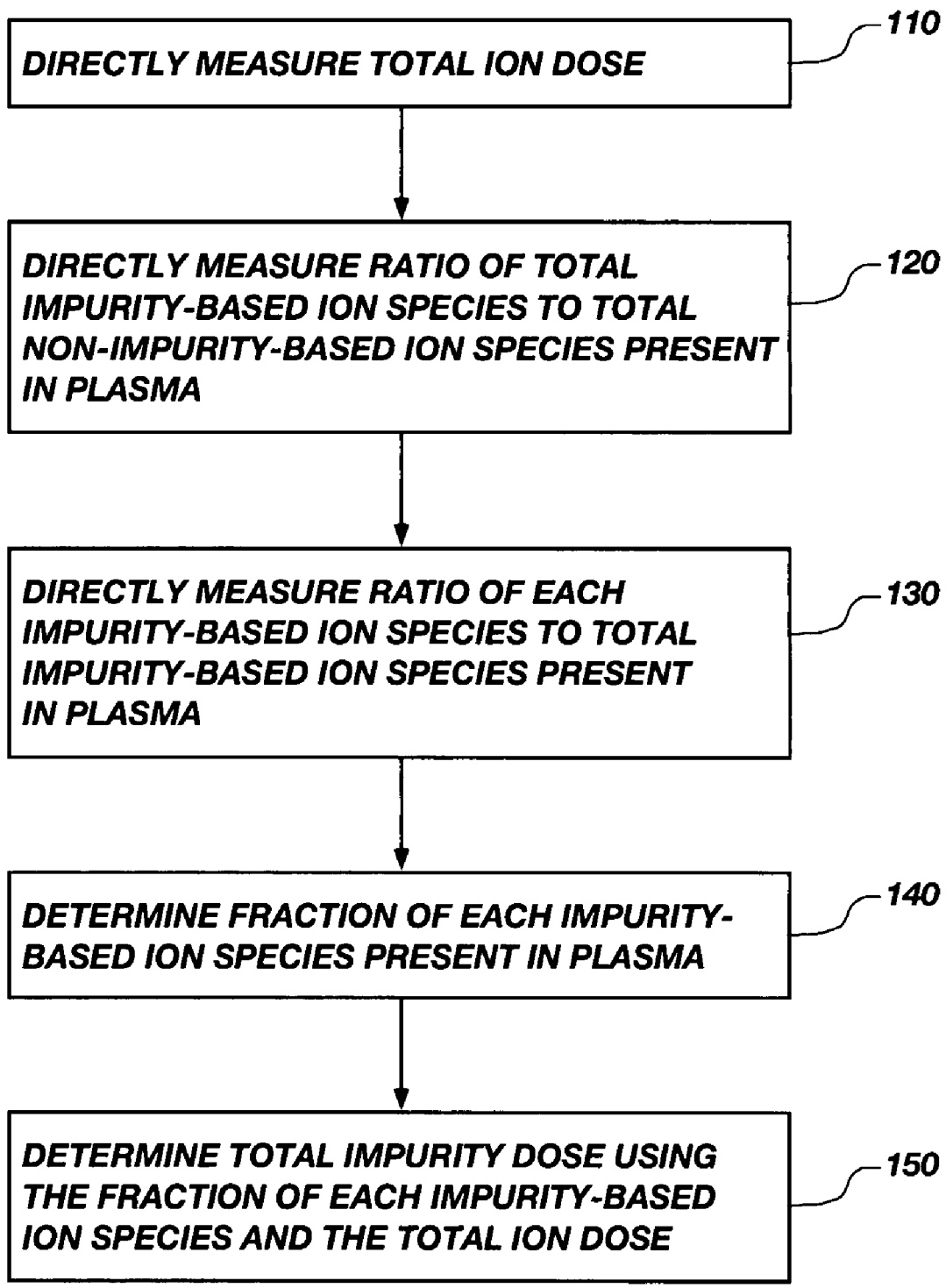
FIG. 1 is a flowchart depicting a method of determining a total impurity dose according to an embodiment of the present invention.

FIG. 1 depicts an embodiment of a method of determining the total impurity dose implanted in the semiconductor substrate during the PLAD process. At 110, a total ion dose in the semiconductor substrate is directly measured. As used herein, the term "directly measured" and grammatical equivalents thereof means and includes quantifying an amount or value in situ or in real time, such as during the PLAD process. In other words, the amount or value is not measured ex situ or after completion of the PLAD process. The directly measured amount may be determined without destroying or otherwise damaging the semiconductor substrate. As previously explained, the total ion dose includes the number of impurity-based ions and non-impurity-based ions implanted per unit area of the semiconductor substrate. At 120, a ratio of total impurity-based ion species present in the plasma to total non-impurity-based ion species present in the plasma is directly measured. Depending on the doping gas used, a plurality of impurity-based ion species and/or a plurality of non-impurity-based ion species may be present in the plasma. The plurality of impurity-based ion species are referred to herein as the "total impurity-based ion species" and the plurality of non-impurity-based ion species are referred to herein as the "total non-impurity-based ion species." The sum of the impurity-based ion species and the non-impurity-based ion species is referred to herein as the "total ion species." Individual impurity-based ion species and individual non-impurity-based ion species are referred to herein as "impurity-based ion species" and "non-impurity-based ion species," respectively. At 130, ratios of each impurity-based ion species to the total impurity-based ion species present in the plasma are directly measured. At 140, the fraction of each impurity-based ion species present in the plasma is determined from the ratios directly measured at 120 and 130. At 150, the fraction of each impurity-based ion species (determined at 140) is used with the total ion dose (directly measured at 110) to determine or calculate the total impurity dose implanted in the semiconductor substrate.

Figure 2:
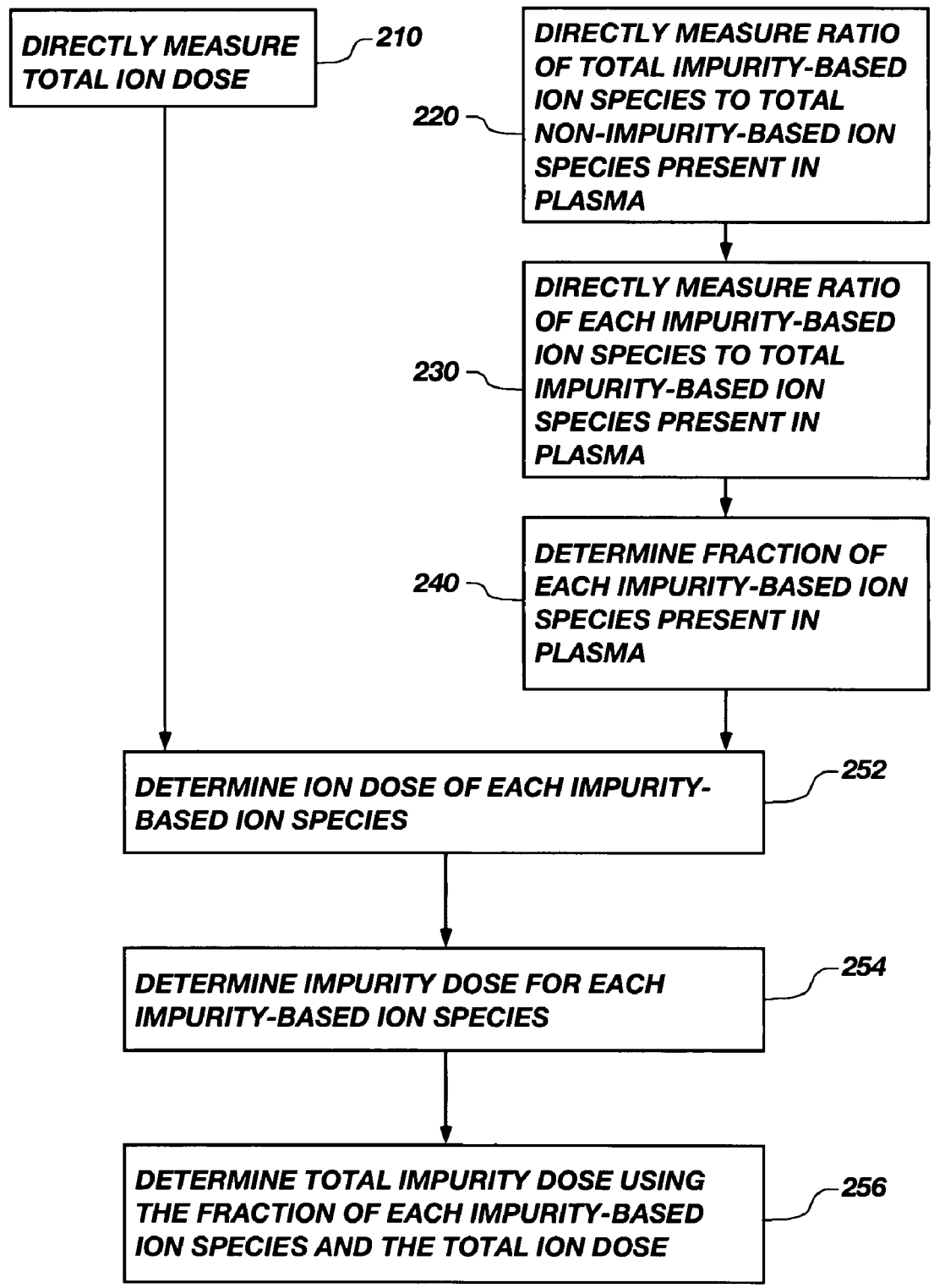
FIG. 2 is a flowchart depicting a method of determining the total impurity dose according to another embodiment of the present invention.

FIG. 2 depicts another embodiment of a method of determining the total impurity dose implanted in the semiconductor substrate. At 210, the total ion dose in the semiconductor substrate is directly measured. In one embodiment, a Faraday cup is used to directly measure the total ion dose in the semiconductor substrate. At 220, which is conducted substantially simultaneously with the total ion dose measurement of 210, the plasma generated during the PLAD process is analyzed to identify the total ion species (i.e., impurity-based ion species and non-impurity-based ion species) present in the plasma and to directly measure the ion composition or plasma chemistry. The total ion species in the plasma may substantially correspond to the total ion species implanted in the semiconductor substrate. For the sake of example only, if a doping gas of $B_2H_6$ in $H_2$ is used, the ion composition may include, but is not limited to, the following ion species: $H^+$, $H_2^+$, $H_3^+$, $B^+$, $B_2^+$, $B_3^+$, $BH_y^+$, $B_2H_y^+$, and $B_3H_y^+$, where y is an integer between 0 and 6. The impurity-based ion species in the $B_2H_6/H_2$ plasma include, but are not limited to, $BH_y^+$, $B_2H_y^+$, and $B_3H_y^+$ and the non-impurity ion species include, but are not limited to, H-based species, such as $H^+$, $H_2^+$, and $H_3^+$. While the methods herein describe determining the total dose of boron implanted in the semiconductor substrate, other doping gases may be used in the PLAD process, in which case different ion species are present. As such, the methods described herein may be used to determine the total dose of other implanted impurities, such as if another doping gas is used. The ratios of the total impurity-based ion species to the total non-impurity-based ion species may also be directly measured. The methods described herein may also be used to determine the total dose of ion species other than impurity-based ion species. For example, non-impurity-based ion species, such as hydrogen or helium, may be determined.

At 230, the ratios of each impurity-based ion species to the total impurity-based ion species present in the plasma may be directly measured. The ratio of each impurity-based ion species to the total impurity-based ion species in the plasma may correspond to the ratio of each impurity-based ion species to the total impurity-based ion species implanted in the semiconductor substrate. In one embodiment, the ratios determined at 220 and 230 are directly measured using an ion mass spectrometer. At 240, the ratios directly measured at 220 and 230 are used to determine or calculate the fraction of each impurity-based ion species present in the plasma relative to the total ion species present in the plasma. For instance, the fraction of total impurity-based ions species ("$F_I$") plus the fraction of total non-impurity-based species ("$F_{NI}$") equals 1, as shown in Equation 1, and $F_I$ equals the ratio of impurity-based ion species ("I") to non-impurity-based ion species ("NI") multiplied by $F_{NI}$, as shown in Equation 2.

$$F_I + F_{NI} = 1 \quad \text{(Equation 1)}$$

$$F_I = (I/NI) \times F_{NI} \quad \text{(Equation 2)}$$

As shown in Equations 3-5, Equation 2 may be substituted for $F_I$ such that:

$$((I/NI) \times F_{NI}) + F_{NI} = 1 \quad \text{(Equation 3)}$$

$$F_{NI} = 1/(1 + (I/NI)) \quad \text{(Equation 4)}$$

$$F_I = 1 - (1/(1 + (I/NI))) \quad \text{(Equation 5)}$$

$F_{NI}$ may then be solved for and $F_I$ then determined.

At 252, the fraction of each impurity-based ion species is multiplied by the total ion dose (directly measured in 210) to determine the ion dose of each impurity-based ion species. At 254, each ion dose of each impurity-based ion species is multiplied by the number of impurity atoms per molecule of the impurity-based ion species to determine the impurity dose for each impurity-based ion species. At 256, the impurity doses for each impurity-based ion species are added together to provide the total impurity dose.

Figure 3:
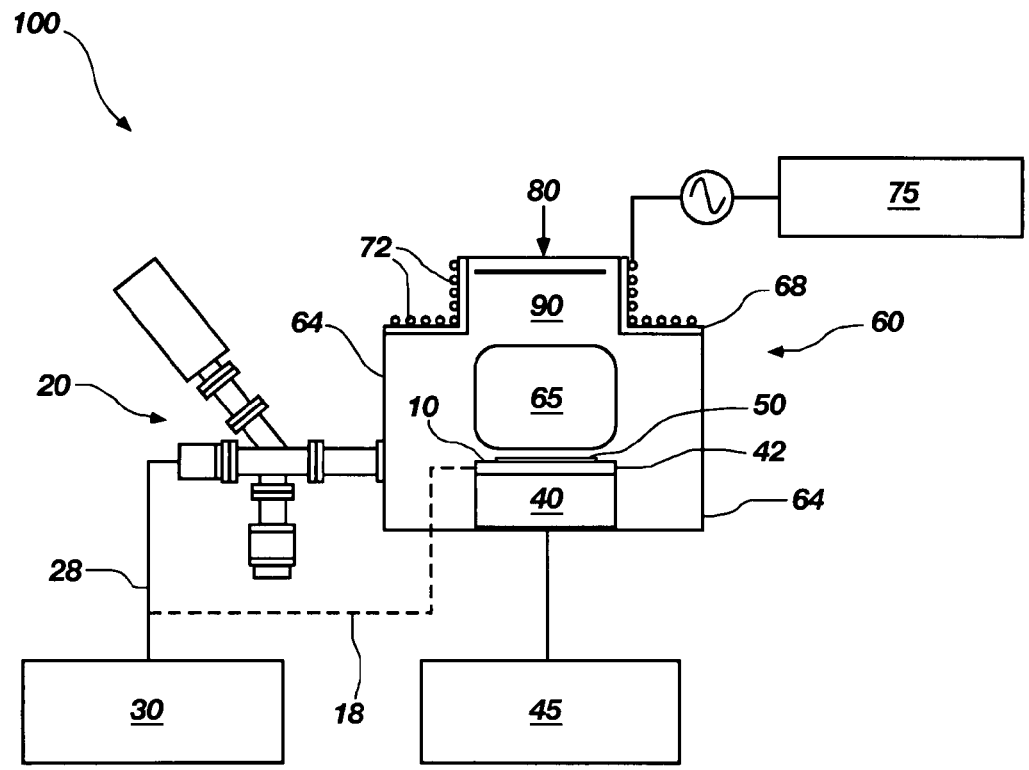
FIG. 3 depicts an embodiment of a PLAD system operable to determine the total impurity dose according to embodiments of the present invention.

FIG. 3 depicts one embodiment of a PLAD system 100 capable of determining the total impurity dose according to embodiments of the present invention. PLAD system 100 includes ion detector 10 and ion mass analyzer 20 operatively coupled to plasma chamber 60. Semiconductor substrate 50 may be placed inside plasma chamber 60 and mounted on chuck 42, which is secured to cathode 40. Doping gas 90 may be introduced into plasma chamber 60 via gas inlet 80 located in hat 68. Doping gas 90 may include at least one impurity to be implanted in semiconductor substrate 50. The impurity may be boron, phosphorus, arsenic, germanium, silicon, other desired impurity, or combinations thereof. For the sake of example only, doping gas 90 may be a hydride doping gas, such as diborane ("$B_2H_6$"), arsine ("$AsH_3$"), phosphine ("$PH_3$"), silane ("$SiH_4$"), germane ("$GeH_4$"), or combinations thereof, or a fluoride doping gas, such as $BF_3$, arsenic trifluoride ("$AsF_3$"), arsenic pentafluoride ("$AsF_5$"), tetrafluorosilane ("$SiF_4$"), germanium tetrafluoride ("$GeF_4$"), or combinations thereof. Doping gas 90 may, optionally, include a dilution gas, such as hydrogen, helium, or other inert gas, to increase the stability of and reduce the toxicity of the doping gas.

Doping gas 90 may be introduced into plasma chamber 60 and exposed to a power source, such as plasma power source 75 and power coils 72, forming plasma 65. Plasma 65 includes the impurity-based ion species and the non-impurity-based ion species. Pulsed power source 45 may provide a negative voltage pulse to the cathode 40 to accelerate positive ions of the impurity-based ion species and the non-impurity-based ion species in plasma 65 towards cathode 40, resulting in implantation of the positive ions in semiconductor substrate 50. Data from ion detector 10 may be used to directly measure the total ion dose implanted in semiconductor substrate 50. Substantially simultaneously, ion mass analyzer 20 may be used to analyze the ion composition of plasma 65. Plasma 65 may be transmitted to ion mass analyzer 20 through a sidewall 64 of plasma chamber 60. Ion mass analyzer 20 may be located and orientated in any manner compatible with analyzing plasma 65. Data from ion mass analyzer 20 may be used to directly measure the ratio of impurity-based ion species to non-impurity-based ion species in plasma 65 and the ratio of each impurity-based ion species to the total impurity-based ion species. The data from ion detector 10 and ion mass analyzer 20 may be transmitted to PLAD system 100 and analyzed. As a result of the transmitted data, implant conditions (such as the implant time) may be adjusted to achieve a desired total impurity dose in semiconductor substrate 50.

PLAD system 100 may be used to determine the total impurity dose based on the data obtained from ion detector 10 and ion mass analyzer 20. In use and operation, the ion detector 10 may be used to measure the total ion dose, which provides the total number of ions per unit area that are implanted in semiconductor substrate 50. However, since the total ion dose includes both impurity-based ion species and non-impurity based ion species, ion detector 10, alone, may not provide the total impurity dose. In use and operation, ion mass analyzer 20 may be used to directly measure the total ion species present in plasma 65, the ratios of the total impurity-based ion species to the total non-impurity-based ion species, and the ratios of each impurity-based ion species to the total impurity-based ion species. These ratios may be used to determine the fraction of each impurity-based ion species present in plasma 65 relative to the total ion species present in plasma 65. The total ion dose directly measured by ion detector 10 may be multiplied by the fraction of each impurity-based ion species present in plasma 65 to provide the ion dose of each impurity-based ion species. The ion dose of each impurity-based ion species may then be used to determine the impurity dose of each impurity-based ion species. The ion dose of a particular impurity-based ion species equals the impurity dose of the particular impurity-based ion species if the impurity-based ion species includes one atom of impurity per molecule (e.g., $BH_y^+$). When the impurity-based ion species includes multiple impurity atoms per molecule (e.g., $B_2H_y^+$), the ion dose of a particular impurity-based ion species may be multiplied by the number of impurity atoms per molecule to determine the impurity dose of the particular impurity-based ion species. The impurity doses of each impurity-based ion species may then be added together to provide the total impurity dose implanted in semiconductor substrate 50.

As previously described, ion detector 10 may be used to detect the total ion dose in semiconductor substrate 50 by measuring the number of ions implanted in semiconductor substrate 50. As illustrated in FIG. 3, ion detector 10 is located in chuck 42 in proximity to semiconductor substrate 50 to measure the total ion dose. Ion detector 10 may be a single detector or a plurality of detectors at various locations in chuck 42 or otherwise in sufficient proximity to semiconductor substrate 50. Positive ions accelerated towards cathode 40 may be detected by ion detector 10 and are representative of the total number of ions implanted in semiconductor substrate 50. In one embodiment, ion detector 10 is at least one Faraday cup. Faraday cups include an aperture for accepting ions (e.g., ions accelerated towards cathode 40). Ions that enter the aperture strike a collecting plate of known surface area and induce a charge in the collecting plate. A current produced by the collecting plate is measured and indicates the charge per unit area of the collecting plate. The number of ions that strike the collecting plate per unit area may then be calculated from the charge per unit area. If the Faraday cup (i.e., ion detector 10) is placed in sufficient proximity to semiconductor substrate 50, then the ions implanted in semiconductor substrate 50 per unit area may be approximately equal to the number of ions per unit area detected by the Faraday cup. As such, the implanted ions per unit area correspond to the total ion dose in semiconductor substrate 50. Any Faraday cup known in the art may be used to determine the total ion dose implanted in semiconductor substrate 50. U.S. Pat. No. 6,050,218, issued Apr. 18, 2000, and U.S. Pat. No. 6,528,805, issued Mar. 4, 2003, the disclosure of each of which is incorporated by reference herein in its entirety, describe Faraday cups that may be used as ion detector 10. Ion detector 10 may communicate with dosimeter 30 via communication line 18. In the embodiment where ion detector 10 is a Faraday cup, communication line 18 may be a fiber-optic pickup for transmitting electric current data from ion detector 10 to dosimeter 30. The data may be transmitted by conventional techniques, which are not described in detail herein. Dosimeter 30 may, in turn, transform the electric current data to the total ion dose implanted in semiconductor substrate 50 by conventional techniques, which are not described in detail herein.

Ion mass analyzer 20 may be used to directly measure the relative amounts of the ion species in plasma 65. In one embodiment, ion mass analyzer 20 is an ion mass spectrometer. For the sake of example only, the ion mass spectrometer may be a HIDEN EQP ion mass and energy analyzer, which is commercially available from Hiden Analytical (Warrington, U.K.). However, any ion mass spectrometer or ion mass spectroscopy method capable of analyzing the ion composition of plasma 65 may be used as ion mass analyzer 20. Ion mass analyzer 20 may include a number of probes or analysis means. Plasma chemistry data from ion mass analyzer 20 may be transmitted to dosimeter 30 via communication line 28, which may be any communication means known in the art. Ion mass analyzer 20 may be used to directly measure the fraction of each impurity-based ion species to the total ion species or dosimeter 30 may perform this function.

Dosimeter 30 may be any analysis equipment compatible with ion detector 10 and ion mass analyzer 20 and configured to analyze data output from ion detector 10 and ion mass analyzer 20, such as a computer. Dosimeter 30 may be used to control and adjust the PLAD process in a closed-loop mode. While dosimeter 30 is illustrated as a single unit, dosimeter 30 may include a plurality of units operatively configured to analyze the data output from ion detector 10 and ion mass analyzer 20. For example, dosimeter 30 may include separate analysis equipment for analyzing the output of ion detector 10 and for analyzing the data output of ion mass analyzer 20. Additionally, the functions performed by dosimeter 30 may be integrated into equipment, hardware, and/or software associated with ion detector 10 and ion mass analyzer 20. The PLAD system 100 including ion detector 10, ion mass analyzer 20, and dosimeter 30 may be configured for closed-loop control by suitably programmed equipment. Signal processing and data manipulation for determining the total impurity dose may be easily implemented by a person of ordinary skill in the art and, therefore, are not described in detail herein. The PLAD system 100 may be implemented as a closed-loop system for conducting and monitoring ion implantation into semiconductor substrate 50. Software for determining the total impurity dose includes computer instructions for execution by a processor of at least one of ion detector 10, ion mass analyzer 20, and dosimeter 30.

While FIG. 3 illustrates PLAD system 100 that includes plasma chamber 60, it is not intended that plasma chamber 60 be limited to the illustrated embodiment, which is a radio frequency ("RF") powered plasma chamber. Plasma power source 75 is depicted as a RF generator and matching network. However, plasma power source 75 may be another plasma power source known in the art. Power source 45 may be used to provide negative voltage pulses to cathode 40 to accelerate the positive ions towards semiconductor substrate 50. Plasma chamber 60 may be configured for generating a continuous plasma or a pulsed plasma during the PLAD process. Plasma chamber 60 may be one commercially available from numerous sources, such as Varian Semiconductor Equipment (Gloucester, Mass.) or Applied Materials, Inc. (Santa Clara, Calif.). U.S. Pat. No. 5,508,227, issued Apr. 16, 1996, U.S. Pat. No. 5,833,016, issued Mar. 16, 1999, U.S. Pat. No. 6,632,482, issued Oct. 14, 2003, and United States Patent Application Publication No. 2006/0237138, published Oct. 26, 2006, the disclosure of each of which is incorporated by reference herein in its entirety, describe plasma chambers that may be used as plasma chamber 60.

The accuracy of determining the total impurity dose may be affected by deposition of a film and sputtering on the semiconductor substrate. For instance, if the dopant to be implanted is boron, a boron-containing film may be deposited on the semiconductor substrate. The film may prevent a portion of the impurity-based ion species from implanting in semiconductor substrate 50. Since the total ion dose measured by ion detector 10 includes these impurity-based ion species, the total indicated ion dose may be artificially high because these impurity-based ion species may not actually be implanted in semiconductor substrate 50. The degree of error in the total impurity dose may depend upon the thickness of the deposited film. Error in the determination of the total impurity dose may be minimized by reducing deposition and sputtering during the PLAD process. For the sake of example only, to reduce deposition, hydrogen or helium may be used as the dilution gas. However, other methods of reducing deposition and sputtering are known in the art and may be used with embodiments of the present invention.

Since the total impurity dose may be determined in situ or during the PLAD process without destroying the semiconductor substrate, embodiments of the present invention may be used for real-time process control of the PLAD process. Ion detector 10 may be used to determine the total ion dose at a predetermined time during the PLAD process and ion mass analyzer 20 may be used to determine the ratios of the total impurity-based ion species to the total non-impurity-based ion species and the ratios of each impurity-based ion species to the total impurity-based ion species present in plasma 65 at the predetermined time. Therefore, the total impurity dose implanted at the predetermined time may be determined. The predetermined time may be a single time during the PLAD process or a periodic time interval throughout the PLAD process. As such, the total impurity dose may be monitored in real-time throughout the PLAD process until a desired total impurity dose in the semiconductor substrate is achieved. If the desired total impurity dose has not been achieved at the predetermined time, the PLAD process may be continued.

The implant conditions of the PLAD process may be modified or altered to achieve the desired total impurity dose. When the desired total impurity dose is achieved, the PLAD process may be stopped. The total impurity dose may also be monitored continuously throughout the PLAD process, and the implant conditions of the PLAD process modified or altered until the desired total impurity dose is achieved. Since the total impurity dose may be determined during the PLAD process and does not necessitate destroying the semiconductor substrate, embodiments of the present invention may be used to reduce manufacturing waste.

The following example serves to explain embodiments of the present invention in more detail. The example is not to be construed as being exhaustive, exclusive or otherwise limiting in any manner as to the scope of this invention.

EXAMPLE

Example 1

Calculation of Total Boron Dose

Figure 4:
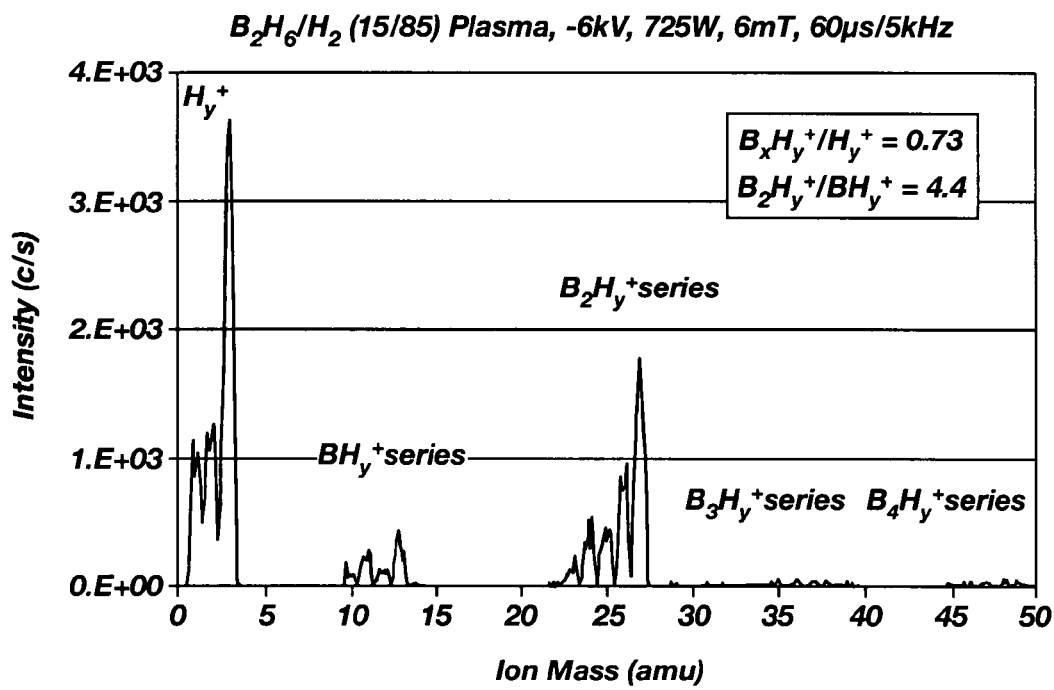
FIG. 4 depicts an example of the ion mass spectrum of a diborane ("$B_2H_6$") plasma used to determine the total impurity dose according to an embodiment of the present invention.

A PLAD process was used to dope a silicon substrate with boron. A $B_2H_6$ plasma was generated using $B_2H_6/H_2$ gas in a 15/85 ratio, a voltage of −6 kV, a pulse duty cycle of 60 μs/5 kHz, a RF power of 725 W, and a pressure of 6 mTorr. The total ion dose in the silicon substrate was determined to be 2E16 ions/$cm^2$ using a Faraday cup. Substantially simultaneously, the plasma chemistry was analyzed by Ion Mass Spectroscopy ("IMS") using a HIDEN EQP mass and energy analyzer. FIG. 4 depicts the mass spectrum of the ion species present in the $B_2H_6$ plasma. As measured by IMS, the ratio of boron-based ("BB") ion species to hydrogen-based ("HB") ion species ("BB/HB") was 0.73. BB/HB was used to calculate the fraction of boron-based ion species ("$F_{BB}$") present in the $B_2H_6$ plasma, which corresponds to the fraction of boron-based ion species implanted in the silicon substrate. According to Equations 1-5 (where $F_{BB}$ is $F_I$, $F_{HB}$ is $F_{NI}$, and BB/HB as measured by IMS is 0.73), $F_{BB}=1-(1/(1+0.73))$. Thus, $F_{BB}$ equals about 0.42. Therefore, the boron-based ion species account for approximately 42% of the total ion species present in the $B_2H_6$ plasma.

The mass spectrum of FIG. 4 also indicates that $H_3^+$ ion species dominate the hydrogen-based ion species with a $H_3^+$: $H_2^+$:$H^+$ ion species ratio of 3.4:1:0.8 and that $B_2H_y^+$ ion species dominate the boron-based ion species with a ratio of $B_2H_y^+$:$BH_y^+$ ion species ratio of 4.4:1. The latter ratio was used to calculate the fraction of $B_2H_y^+$ ion species ("$F_{B2}$") present in the $B_2H_6$ plasma. According to Equations 1-5, $F_{B2}=1-(1/(1+4.4))$. Thus, $F_{B2}$ equals about 0.81 and the $B_2H_y^+$ ion species accounts for approximately 81% of the total boron-based ion species.

Based on this information, the boron-based ion dose was determined by multiplying 0.42 (the percentage of boron-based ion species) and 2E16 ions/$cm^2$ (the total ion dose), which equals 8.4E15 ions/$cm^2$. The $B_2H_y^+$ ion dose was determined by multiplying 0.81 (the percentage of $B_2H_y^+$ ion species) and 8.4E15 ions/$cm^2$, which equals 6.8E15 ions/$cm^2$. The $BH_y^+$ ion dose is the balance of the boron-based ion dose, which equals 1.6E15 ions/$cm^2$. Since the $B_2H_y^+$ ion dose has two atoms of boron per molecule, the boron dose from the $B_2H_y^+$ ion dose is 2 atoms/ion×6.8E15 ions/$cm^2$, which equals 1.36 E16 atoms/$cm^2$. The boron dose from the $BH_y^+$ ion dose is 1 atom/ion×1.6E15 ions/$cm^2$, which equals 1.6 E15 atoms/$cm^2$. The total boron dose is the sum of 1.36E16 atoms/$cm^2$ and 1.6E15 atoms/$cm^2$, which equals 1.52E16 atoms/$cm^2$. The final implanted boron profile would be a superposition of a 3 keV (equivalent to 6 keV of $B_2^+$ ion) energy, 1.36E16 atoms/cm² dose boron implant and a 6 keV energy, 1.6E15 atoms/cm² dose boron implant.

Figure 5:
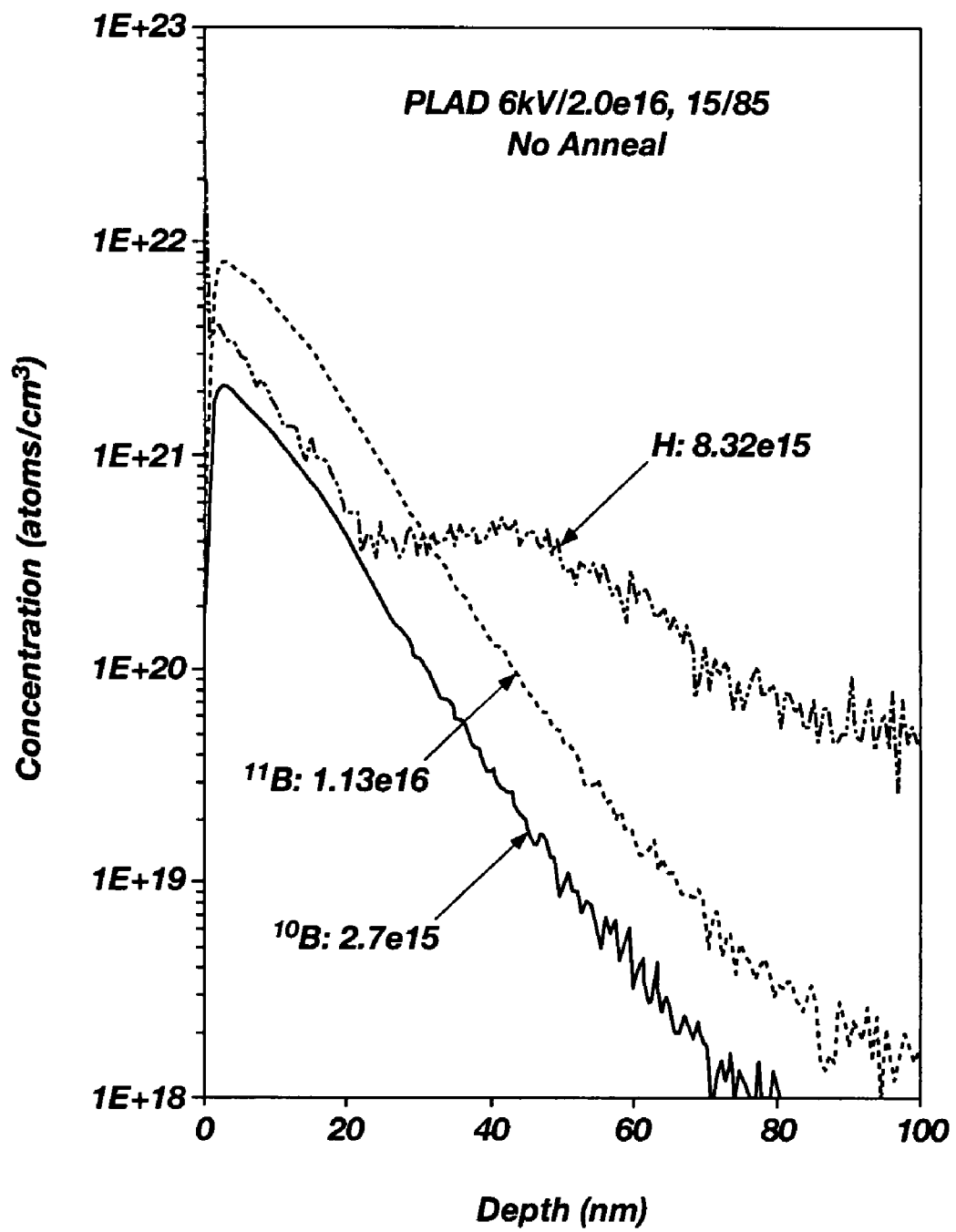
FIG. 5 depicts a SIMS measurement of boron implantation after a PLAD process.

To confirm the results of the above calculation of the total boron dose, SIMS was used to measure the total boron dose in a silicon substrate implanted with boron using the same implant conditions described above and the same total ion dose of 2E16 ions/cm². FIG. 5 depicts boron ($^{10}B$ and $^{11}B$) and hydrogen concentration profile curves calculated by SIMS. The SIMS measurement was conducted prior to annealing the silicon substrate and, therefore, hydrogen was present in the silicon substrate. Each profile curve was integrated to determine the implanted dose of each atom. The $^{10}B$ dose was determined to be 2.7E15 atoms/cm², the $^{11}B$ dose was determined to be 1.13E16 atoms/cm², and the H dose was determined to be 8.32E15. The total boron dose is the sum of the $^{10}B$ dose and the $^{11}B$ dose and equals 1.4E16 atoms/cm². This result is in good agreement with the total boron dose of 1.52E16 atoms/cm² determined by the method of the embodiment of the present invention, especially considering the deposition of the boron-containing film on the semiconductor substrate during the PLAD process.

While the invention is susceptible to various modifications as well as alternative forms and implementations, specific embodiments have been shown by way of example in the drawings and have been described in detail herein. However, it should be understood that the invention is not limited to the particular embodiments disclosed. Rather, the invention encompasses all modifications, equivalents, and alternatives falling within the spirit and scope of the invention as defined by the following appended claims.

What is claimed is:

1. A method of determining a total impurity dose, comprising:
    exposing a semiconductor substrate to a plasma comprising a plurality of impurity-based ion species and a plurality of non-impurity-based ion species;
    directly measuring a total ion dose implanted in the semiconductor substrate;
    determining in situ a fraction of a total impurity-based ion species to a total non-impurity-based ion species in the plasma;
    determining in situ a fraction of each of the plurality of impurity-based ion species to the total impurity-based ion species in the plasma; and
    determining a total impurity dose using the total ion dose and the fractions.

2. The method of claim 1, wherein directly measuring a total ion dose implanted in the semiconductor substrate comprises determining the total ion dose using a Faraday cup.

3. The method of claim 1, wherein determining in situ a fraction of a total impurity-based ion species to a total non-impurity-based ion species in the plasma comprises directly measuring a ratio of the total impurity-based ion species to the total non-impurity-based ion species in the plasma by ion mass spectroscopy.

4. The method of claim 1, wherein determining in situ a fraction of each of the plurality of impurity-based ion species to the total impurity-based ion species in the plasma comprises directly measuring a ratio of each of the plurality of impurity-based ion species to the total impurity-based ion species in the plasma by ion mass spectroscopy.

5. The method of claim 1, wherein determining a total impurity dose using the total ion dose and the fractions comprises multiplying the fraction of each of the plurality of impurity-based ion species by the total ion dose to determine the ion dose of each of the impurity-based ion species, multiplying the ion dose of each of the impurity-based ion species by the number of impurity atoms per molecule of the impurity-based ion species to determine the impurity dose of each of the impurity-based ion species, and adding the impurity doses of each of the impurity-based ion species.

6. A method of determining a total impurity dose, comprising:
    exposing a semiconductor substrate to a plasma comprising a plurality of impurity-based ion species and a plurality of non-impurity-based ion species;
    directly measuring a total ion dose implanted in the semiconductor substrate;
    directly measuring a ratio of a total impurity-based ion species to a total non-impurity-based ion species in the plasma;
    directly measuring a ratio of each of the plurality of impurity-based ion species to the total impurity-based ion species in the plasma; and
    determining a total impurity dose using the total ion dose and the ratios.

7. The method of claim 6, wherein directly measuring a total ion dose implanted in the semiconductor substrate comprises utilizing a Faraday cup.

8. The method of claim 6, wherein directly measuring a ratio of a total impurity-based ion species to a total non-impurity-based ion species in the plasma comprises analyzing an ion composition of the plasma to determine the ratio of the total impurity-based ion species to the total non-impurity-based ion species.

9. The method of claim 6, wherein directly measuring a ratio of each of the plurality of impurity-based ion species to the total impurity-based ion species in the plasma comprises analyzing an ion composition of the plasma to determine the ratio of each of the plurality of impurity-based ion species to the total impurity-based ion species.

10. The method of claim 6, wherein directly measuring a ratio of each of the plurality of impurity-based ion species to the total impurity-based ion species in the plasma and directly measuring a ratio of a total impurity-based ion species to a total non-impurity-based ion species in the plasma comprises analyzing the plasma with a mass spectrometer.

11. The method of claim 6, wherein directly measuring a total ion dose implanted in the semiconductor substrate, directly measuring a ratio of a total impurity-based ion species to a total non-impurity-based ion species in the plasma, and directly measuring a ratio of each of the plurality of impurity-based ion species to the total impurity-based ion species in the plasma comprises substantially simultaneously measuring the total ion dose with a Faraday cup and measuring the ratios with a mass spectrometer.

12. The method of claim 6, wherein directly measuring a total ion dose implanted in the semiconductor substrate and directly measuring a ratio of each of the plurality of impurity-based ion species to the total impurity-based ion species in the plasma comprises substantially simultaneously analyzing the plasma with a mass spectrometer to directly measure the total ion dose and the ratio of each of the plurality of impurity-based ion species to the total impurity-based ion species.

13. The method of claim 6, further comprising converting the ratio of the total impurity-based ion species to the total non-impurity-based ion species to a fraction.

14. The method of claim 6, further comprising converting the ratios of each of the plurality of impurity-based ion species to the total impurity-based ion species to a fraction.

15. The method of claim 6, wherein determining a total impurity dose using the total ion dose and the ratios comprises determining the total impurity dose in situ.

16. The method of claim 6, wherein determining a total impurity dose using the total ion dose and the ratios comprises multiplying a fraction of each of the plurality of impurity-based ion species by the total ion dose to determine the ion dose of each impurity-based ion species, multiplying the ion dose of each impurity-based ion species by the number of impurity atoms per molecule of the impurity-based ion species to determine the impurity dose for each impurity-based ion species, and adding the impurity doses for each of the impurity-based ion species.

17. A method of determining a total impurity dose, comprising:
 exposing a semiconductor substrate to a plasma comprising a plurality of impurity-based ion species and a plurality of non-impurity-based ion species;
 utilizing a Faraday cup to directly measure a total ion dose implanted in the semiconductor substrate;
 utilizing an ion mass spectrometer to directly measure a ratio of a total impurity-based ion species to a total non-impurity-based ion species in the plasma and to directly measure a ratio of each of the plurality of impurity-based ion species to the total impurity-based ion species in the plasma; and
 determining a total impurity dose using the total ion dose and the ratios.

18. A method of monitoring a total impurity dose, comprising:
 selecting a desired total impurity dose to be implanted in a semiconductor substrate;
 exposing the semiconductor substrate to a plasma comprising a plurality of impurity-based ion species and a plurality of non-impurity-based ion species;
 directly measuring a total ion dose implanted in the semiconductor substrate at a predetermined time;
 directly measuring a ratio of a total impurity-based ion species to a total non-impurity-based ion species in the plasma at the predetermined time;
 directly measuring a ratio of each of the plurality of impurity-based ion species to the total impurity-based ion species in the plasma at the predetermined time; and
 determining a total impurity dose using the total ion dose and the ratios.

19. The method of claim 18, further comprising exposing the semiconductor substrate to the plasma for an additional amount of time if the desired total impurity dose has not been achieved.

20. A method of configuring a plasma doping system, comprising:
 configuring an ion detector for directly measuring a total ion dose to be implanted in a semiconductor substrate;
 configuring an ion mass spectrometer for directly measuring a ratio of a total impurity-based ion species to a total non-impurity-based ion species in a plasma and directly measuring ratios of individual impurity-based ion species to the total impurity-based ion species in the plasma;
 configuring a dosimeter for determining an ion dose of each impurity-based ion species in the plasma and using the ion doses of each impurity-based ion species and total ion dose to determine the total impurity dose; and
 placing the ion detector, the ion mass spectrometer, and the dosimeter in mutual communication.

21. The method of claim 20, wherein configuring an ion detector for directly measuring a total ion dose to be implanted in a semiconductor substrate comprises configuring a Faraday cup.

22. The method of claim 20, wherein configuring an ion mass spectrometer for directly measuring a ratio of a total impurity-based ion species to a total non-impurity-based ion species in a plasma and directly measuring ratios of individual impurity-based ion species to the total impurity-based ion species in the plasma comprises configuring a mass spectrometer.

\* \* \* \* \*